United States Patent [19]

Kilichowski et al.

[11] 4,288,513

[45] Sep. 8, 1981

[54] PHOTORESIST OF POLYVINYL ALCOHOL AND FERRIC DICHROMATE

[75] Inventors: Kurt B. Kilichowski, N. Framingham; Peter Cukor, Natick; Charles Brecher, Lexington, all of Mass.

[73] Assignee: GTE Laboratories Incorporated, Waltham, Mass.

[21] Appl. No.: 893,547

[22] Filed: Apr. 5, 1978

Related U.S. Application Data

[63] Continuation of Ser. No. 734,897, Oct. 22, 1976, abandoned.

[51] Int. Cl.³ .......................... G03C 5/00; G03C 1/68
[52] U.S. Cl. .................................. 430/28; 204/159.14; 204/159.24; 430/270; 430/909; 430/914; 430/926; 430/927
[58] Field of Search ................ 96/36.1, 93, 92, 115 R; 204/159.14, 159.24

[56] References Cited

U.S. PATENT DOCUMENTS

| | | | |
|---|---|---|---|
| 1,892,682 | 1/1933 | Richards | 96/93 |
| 3,317,319 | 5/1967 | Mayaud | 96/36.1 |
| 3,615,458 | 10/1971 | Dykstra | 96/36.1 X |
| 3,658,534 | 4/1972 | Ishitani et al. | 96/92 X |
| 3,966,474 | 6/1976 | Harper | 96/36.1 |

OTHER PUBLICATIONS

Tritton; F. J., "The Photographic Journal", 6/29, pp. 281-285.
Kosar; J., "Light-Sensitive Systems", 1965, pp. 14, 25-26.

*Primary Examiner*—Edward C. Kimlin
*Attorney, Agent, or Firm*—David M. Keay

[57] ABSTRACT

To accelerate printing of resist materials on a CRT color panel, an additive is incorporated into the resist to enhance cross-linking upon exposure to actinic radiation.

11 Claims, 5 Drawing Figures

PHOTORESIST OF POLYVINYL ALCOHOL AND FERRIC DICHROMATE

This is a continuation of application Ser. No. 734,897, filed Oct. 22, 1976, now abandoned.

BACKGROUND OF THE INVENTION

The present invention relates to photoresist materials and more particularly to an improved photoresist for use in a CRT color panel.

In the manufacture of cathode-ray tubes for color television receivers, phosphor color dots are formed on a color panel coextensive with the face plate of the tube. According to a conventional manufacturing technique, a support is coated with a phosphor-containing resist material, conventionally including polyvinyl alcohol (PVA) and ammonium dichromate. The resist material is exposed to an optical radiation source, such as a mercury vapor arc lamp, located on the opposite side of a shadow mask. Where the shadow mask passes optical radiation to the resist, the resist material is cross-linked or differentially hardened relative to those portions of the resist which receive no optical radiation. The phosphors incorporated into the resist material are fixed or printed on the panel as a result of this cross-linking. The non-hardened or unexposed areas of resist material are washed from the panel, leaving the phosphor dots in place on a non-fluorescing background.

In order to minimize the interference generated by ambient light reflected from the face plate of the tube, another technique was developed to provide a black matrix which surrounds each phosphor dot thereby providing a means of absorbing incident light. The black matrix/phosphor dot system is formed on a color panel by establishing a transparent dot pattern on the face plate of the tube by conventional resist techniques. Thereafter, the face plate is overcoated with a graphite layer which is adhered to the face plate. The dot pattern is selectively dissolved leaving a black matrix with a plurality of holes therein. The black matrix is then overcoated by the conventional phosphor-containing resist material which is then selectively cross-linked by conventional resist techniques to affix the phosphor in each of the holes thereby completing the black matrix/phosphor dot system.

When a prior art resist including polyvinyl alcohol and ammonium dichromate is exposed to radiation from a mercury arc vapor lamp, several minutes exposure time are required to satisfactorily cross-link and harden the phosphor dot areas. The long exposure time is a bottleneck in the manufacture of color tubes for television receivers. To alleviate assembly delays which would otherwise result, storage loops can be built into the assembly line to accumulate unprocessed color panels. As an alternative, parallel print stations may be incorporated into the assembly line. The use of parallel print stations or storage loops does, of course, increase the cost of manufacturing the cathode-ray tubes.

Attempts have been made to reduce cross-linking time by utilizing high energy optical radiation produced by a laser. However, attempts to cross-link prior art resist materials by exposure to laser radiation have not been completely successful in a time period not requiring storage loops. Prior art resist materials have maximum sensitivity in a dichromate absorption band of 365 nanometers (nm) and decreasing sensitivity out to 440 nm.

One suitable laser is an ion/argon laser which has emission bands from 457.9 nm to 514 nm. Since the prior art resist material is relatively insensitive to incident radiation in the emission bands of the laser, it is possible to reduce cross-linking time of prior art resists only by increasing the power output of the laser. Increasing power is undesirable as it can result in poor quality color panels.

It is therefore desirable to provide photoresists which exhibit enhanced sensitivity especially in the blue-green region of the spectrum. Such photoresists would result in more efficient energy utilization and would have a response time suitable for use with a laser scanner.

A resist with greater blue-green sensitivity would also result in more efficient use of the mercury arc lamps currently used in conventional systems. The high pressure mercury arc lamp also has useful emission in the blue-green region of the spectrum which is not utilized by current resist materials. Increased blue-green response would therefore be desirable for use with mercury arc exposure systems to decrease the exposure time presently required.

SUMMARY OF THE INVENTION

The present invention provides an improved photoresist material having enhanced sensitivity to radiation in the blue-green region of the spectrum. The resist is improved by incorporating an additive which facilitates the cross-linking of the resist upon exposure to blue-green energy emission.

While the specification concludes with claims particularly pointing out and distinctly claiming that which is regarded as the present invention, further details of preferred embodiments of the invention may be more readily ascertained from the following detailed description.

DETAILED DESCRIPTION

Figure 1:
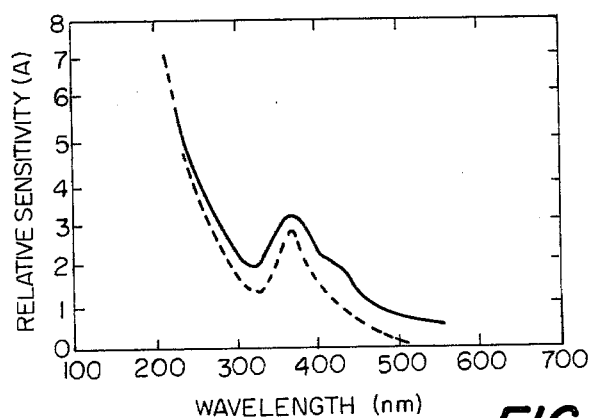
FIG. 1 illustrates the absorption spectra of aqueous solutions of ferric dichromate and ammonium dichromate.

The present invention provides enhancement of the sensitivity of the resist, especially in the blue-green region of the spectrum, by extending the absorption spectrum of the conventional PVA-dichromate photoresist mixture through admixture therewith of a transition metal salt in which the transition metal is in its highest valence state, thereby complexing at least a portion of the dichromate with the transition metal.

While not wishing to be bound by any theory or mechanism, it is currently believed that by changing the cationic moiety of the dichromate salt, it is possible to bring about a significant increase in the light absorbing properties of the sensitizer. Retention of the ionic character of the salt does not appear to yield sensitivity increase due to the fact that no transfer of energy is possible from the cation to the anion when these moieties are in dissociated form as are ionic salts in aqueous solutions. It has now been found, however, that the spectral absorptive properties can be significantly and beneficially altered by complexing the dichromate ligand to a transition metal in its highest valence state. In this manner, it is currently believed that the absorption contribution due to the added transition metal may give rise to a direct intramolecular energy transfer to the dichromate ligand. Thus, the complex formation does not alter the chromium absorption peak at 365 nm but has the enhancing effect of adding the absorption peak of the transition metal moiety in the visible region of the spectrum.

A wide variety of transition metal salts can be suitably employed in the present invention. Thus, inorganic salts of transition metal from Groups 3b, 4b, 5b, 6b, 7b, 8, 1b and 2b of the Periodic Table of the Elements (Handbook of Chemistry and Physics, 45th ed. (1964), The Chemical Rubber Co., Cleveland, Ohio, page B-2) can be used. Preferred salts are dichromate salts wherein the transition metal is in its highest valence state and wherein the salt is an effective cross-linking agent for poly(viny alcohol) and absorbs in the visible region of the spectrum. These salts can be employed, per se, or can be generated in situ by reaction with ammonium dichromate or alkali metal dichromates such as sodium dichromate, potassium dichromate and the like. In such instances, the sensitizer is a mixture of the transition metal salt and ammonium or alkali metal dichromate salts. It has been found that such mixtures are effective in extending the absorption spectrum of the sensitizer into the visible region of the spectrum when the transition metal salt is present in the mixture in amounts of from about 20 to about 100 percent by weight and preferably from about 60 to about 90 percent by weight.

Illustrative transition metal salts are iron (+3) dichromate, nickel (+2) dichromate, zinc (+2) dichromate, Mg(+2) dichromate, Cu(+2) dichromate, and the like. Suitable mixtures of transition metal salts and ammonium or alkali metal dichromate salts include ferric dichromate/ammonium dichromate, ferric dichromate/sodium dichromate, ferric dichromate/potassium dichromate, ferric dichromate/zinc dichromate, and the like.

Illustrative of the formation of a transition metal complex suitable for use in the present invention is the reaction between ferric thiocyanate and ammonium dichromate as shown below:

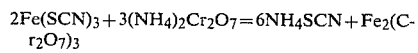

$$2Fe(SCN)_3 + 3(NH_4)_2Cr_2O_7 = 6NH_4SCN + Fe_2(Cr_2O_7)_3$$

This reaction can be effected in situ and the resulting reaction mixture used as the sensitizer or, the resulting iron complex can be recovered and used, per se.

The above illustrative reaction changes the color of the chromium compound to make it more absorptive in the blue-green energy emission region without interferring with the basic light-induced cross-linking mechanism.

The sensitivity of the resist has been found to be increased threefold upon the addition of 0.04 percent iron into the resist mixture. At these low concentrations phosphor poisoning due to residual iron during baking of the panel has been found to be negligible. The shelf life of the resist remains unchanged when small amounts of iron are added.

In addition to the ferric thiocyanate mentioned above, other iron salts such as ferric sulfate, ferric acetate, ferric formate and other water soluble ferric compounds have been found to be useful in forming transition metal dichromate complexes which impart similar improvements in the sensitivity of resist mixtures into which they are incorporated.

Due to the increased absorption of the transition metal dichromate complexes of the present invention, less energy is able to penetrate the resist film to the resist/substrate interface. This energy is important as it is responsible for the adhesion of the photo-hardened phosphor dots to the substrate. Accordingly, it is considered preferable that the photoresist-forming composition be applied in as thin a continuous film as possible. For example, resist film thicknesses of from about 0.5 to 1.0 mils for phosphor loaded resist and from about 0.01 to 0.5 mils are considered desirable for non-phosphor loaded resists. It has been found advantageous to add a surfactant to the photoresist mixture as an aid in applying a thin film of the resist mixture to the substrate. Suitable surfactants are anionic surfactants such as sodium 2-ethyl hexanate, sodium polyacrylate, ammonium 2-ethylhexanoate, ammonium polyacrylate and the like. The surfactant can be admixed with the resist composition in amounts ranging from about 1 to 5 percent solids by weight. Use of sodium 2-ethyl hexanate as the surfactant is preferred.

The following examples further illustrate the present invention. These examples are for illustrative purposes only and are not to be read or construed as imposing any limitations upon the scope of the present invention.

Resist sensitivity curves or gamma curves and spectral sensitivity curves or action spectra were generated for the state of the art ammonium dichromate/PVA system and the enhanced sensitivity systems of the present invention. The evaluation encompassed both black matrix and phosphor screening (with and without phosphor) resists. Sensitivity curves were generated by mercury arc and laser sources; while action spectra utilized the broad flat emission of a xenon source coupled to a monochrometer. Emphasis was placed on a continuity of power output from each source to ensure reproducible comparisons between photoresist systems. Extra care was taken in the maintenance of constant pH in all resist solutions so that sensitivity enhancement due to increased $H_3O+$ concentration would not be a contributing factor.

Detailed information on sensitivity of photoresist solutions were obtained by measuring the thickness of exposed and developed resist films as a function of light exposure. IR and fluorescence spectroscopy were utilized for this purpose. The data was then compiled to obtain relative sensitivities and spectral response of all systems tested. Sensitivities were defined as the initial slope of the relative thickness vs. light exposure curves. Spectral responses were defined as relative thickness vs. wavelength of exposure.

Glass substrates for application of photoresist coatings were obtained from Fisher Scientific Co. Each $2 \times 2$ inch slide was processed by ultrasonic agitation in an aqueous solution of an alkyl aryl sodium sulfonate detergent (Alconox available from Alconox Inc.) to remove any plastic or oil coating and rinsed thoroughly with distilled water. The slides were then etched in a 10% aqueous solution of ammonium fluoride, washed thoroughly with distilled water and dried with an air gun.

Polyvinyl alcohols (PVA) for stock solutions were obtained from Airco Co. under the trade name Vinol. Stock solutions containing 6% polymer by weight were prepared by slowly adding 6 gm of PVA to 100 gms distilled water with rapid stirring. After dissolution is complete, the solution is centrifuged to remove any undissolved particles. The stock ammonium dichromate solution was prepared by dissolving 125 gm of reagent grade ammonium dichromate, available from Fisher Scientific Co., in 1 liter of distilled water.

Iron dichromate was initially prepared by reacting stoichiometric quantities of ferric acetate with chromic anhydride in aqueous solution on a steam bath. After dryness is achieved, the iron dichromate salt is redissolved in distilled water. The distilled water is then removed by rotary flash evaporation which ensures that remaining acetic acid will also be removed. The sample is then quantitatively analyzed for percent iron and chromium. A stock solution is then prepared to contain the same percent by weight chromium as in the case of the state of the art ammonium dichromate.

Alternatively, the iron dichromate was formed in situ by adding to the ammonium dichromate containing resist, $Fe(SCN)_3$ and allowing the following chemical reaction to take place within the resist:

$$2Fe(SCN)_3 + 3(NH_4)_2Cr_2O_7 = 6NH_4SCN + Fe_2(Cr_2O_7)_3$$

Sensitized photoresist solutions were prepared by mixing the PVA stock solutions with various sensitizers, humectant and surfactants. The composition of the photoresist solutions are given in Table I. The prior art methanol based photoresist was initially used to study sensitization of phosphor loaded mixtures.

The pH of all solutions was adjusted to 6.1 with ammonium hydroxide or NaOH. All solutions were tightly stoppered and stored in a refrigerator to minimize spoilage and increase shelf life.

Phosphor loaded samples were prepared by mixing 10 gm of phosphor material with 10 gm of sensitized photoresist. The resulting composition consisted of 3.5 percent photoresist and 96.5 percent phosphor, based on total solids content.

All sensitized photoresist solutions were applied to glass sample plaques by spinning material at 500 rpm for 5 sec. with the aid of a Headway spinner. Samples were then dried for 2 minutes at 70° C. in a drying oven.

TABLE I

| Composition of Photoresist Solutions (% Additives) | | |
|---|---|---|
| Solution 1 | 25–50% | 6% PVA stock solution |
| | 1–5% | 12–5% ammonium dichromate solution |
| | Balance | distilled $H_2O$ |
| Solution 2 | 20–40% | 6% PVA stock solution |
| | 50–60% | methanol |
| | 0.5–2% | 12.5% ammonium dichromate solution |
| | 0.05–0.3% | humectant |
| | 0.01–0.05% | wetting agent |
| | Balance | distilled $H_2O$ |
| Solution 3 | 25–50% | 6% PVA stock solution |
| | 1–5% | 12.5% iron dichromate solution |
| | Balance | distilled $H_2O$ |
| Solution 4 | 20–40% | 6% PVA stock solution |
| | 50–60% | Methanol |
| | 0.5–2% | 12.5% iron dichromate solution |
| | 0.05–0.3% | humectant |
| | 0.01–0.05% | wetting agent |
| | Balance | distilled $H_2O$ |
| Solution 5 | 20–30% | 6% PVA stock solution |
| | 1–5% | 1% iron salt solution |
| | 0.5–3.0% | 12.5% ammonium dichromate solution |

TABLE I-continued

| Composition of Photoresist Solutions (% Additives) | | |
|---|---|---|
| | 1–5% | 5% sodium 2-ethylhexanoate solution |
| | 0.1–0.5% | humectant |
| | Balance | distilled $H_2O$ |

One of three light sources was utilized for all tests performed. A high pressure mercury arc lamp operated at 200 watts was used to emulate state of the art exposures and a 2 watt ion/argon laser was used for exposing films to evaluate their sensitivity response in the blue-green region for use with the laser scanner system. A 1000 watt Xenon arc lamp coupled to a ¼ meter Jarrell-Ash Monochrometer was used to generate spectral response data.

Power output of the sources was monitored and adjusted with the aid of an Eppley Bi/Ag thermopile coupled to a Kiethly microvoltmeter. Extra precautions were taken to maintain equivalence of power levels from the sources. The power output of the mercury arc source was regulated by placing metallized neutral density filters with flat UV visible response in the path of incident radiation. Laser power output was regulated by directly adjusting laser tube voltage. Xenon arc source power output was regulated by varying exposure times. Total exposure times on a given resist varied from 0 sec. to, in some cases, 4–10 minutes. Individual samples were exposed with sequential steps of increase of 10–15 sec. Since power output of the sources were known by thermopile measurement, all exposure levels were converted to power levels and expressed as ergs/cm$^2$. A Coherant Radiation Model 201 absorption head and meter was used to monitor laser output for experiments in which the laser scanner was simulated. This was accomplished by using the full power output of the laser and rotating the sample through the light beam using a spinning disc whose speed was set in such a manner that three passes were equivalent to exposure to the laser scanner system.

Exposed sample plaques were developed by first spraying with a steady uniform mist of water followed by rinsing under a steady, uniform stream of tap water for approximately 15–30 sec. Developed samples were then dried with a heatgun.

Measurements of photoresist sensitivity were made on a relative basis for both nonphosphor and phosphor loaded resists. The thickness of the developed resist film was measured as a function of light exposure. A Perkin Elmer Model 621 Infrared Spectrophotometer was used for thickness measurements on nonphosphor containing samples. Instrument sensitivity was set at 10X with slit set at 2X due to the weak absorption of the thin film samples. Before coating, all glass substrates were matched to a reference slide to minimize effects due to differences in the glass. The wavelength area of interest for resist coated samples was the C-H stretch at 2840 cm$^{-1}$. The $\Delta A$ or relative absorption value was taken by subtracting from the absorption value at the height of the C-H stretch band the absorption of the baseline. The $\Delta A$ value is a measure of the thickness which is proportional to resist insolubility. For all samples, a measurement was taken before exposure for the initial relative film thickness. This data could then be used to normalize data from sample to sample. Exposures were made using a mask with a 0.5 cm $\times$ 2 cm stripe which enable the printing at four power levels (achieved by time variation) on each plaque. When the difference in absorption (ΔA) or relative solubility is plotted against power delivered during exposure, a gamma cruve is obtained. From the initial slopes of these curves, the relative gammas are obtained which can be compared to the relative gammas obtained for the state of the art resist to yield information on the magnitude of sensitivity increase or decrease. Similarly, when the difference in absorption (ΔA) is plotted against wavelength a spectral sensitivity curve is obtained.

Sensitivity measurements for phosphor loaded samples were handled utilizing fluorescence spectrophotometry. The instrument used was a Carey 14 UV Visible Spectrophotometer operated in the single beam mode. Sample plaques were placed at the far end of the sample compartment as close to the phototube as possible. UV cut off filters were placed between the sample and photomultiplier so that only fluorescence emission would be monitored. Measurements were made on samples both before and after exposure. Values obtained before exposure were utilized for normalization. Differences in emission were calculated to be differences in film thickness which is a measure of relative solubility. The quantum yield $$\left(\frac{I_o}{I} - 1\right),$$

where $I_o$ was initial fluorescence intensity and I final fluorescence intensity, were plotted against power delivered during exposure. The resultant curve which is a modified Stern-Volmer plot has the same general appearance as the ΔA vs. power delivered plots for non-phosphor samples and is also a gamma curve. The initial slopes of these curves are relative gammas and serve as a measure of sensitivity increase or decrease for phosphor loaded samples. The relative gammas obtained by the fluorescence method were comparable to absorption data and the two were used interchangeably. Similarly when the quantum yield was plotted against wave length, a spectral sensitivity curve was obtained.

Figure 2:
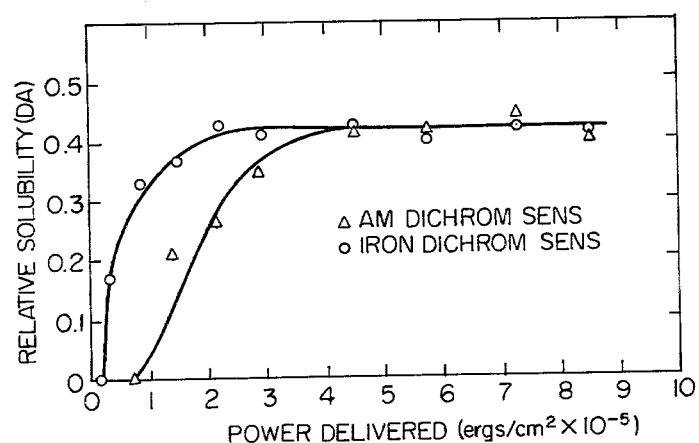
FIGS. 2 and 3 illustrate gamma curves for iron dichromated PVA photoresists in comparison with ammonium dichromated PVA photoresists for two different types of PVA.
Figure 3:
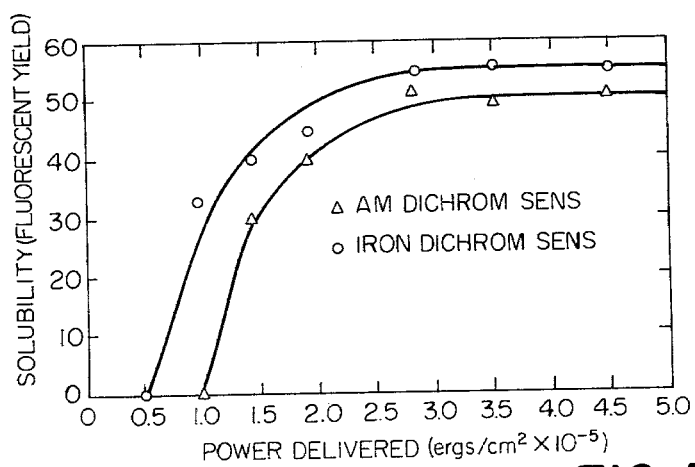
Figure 5:
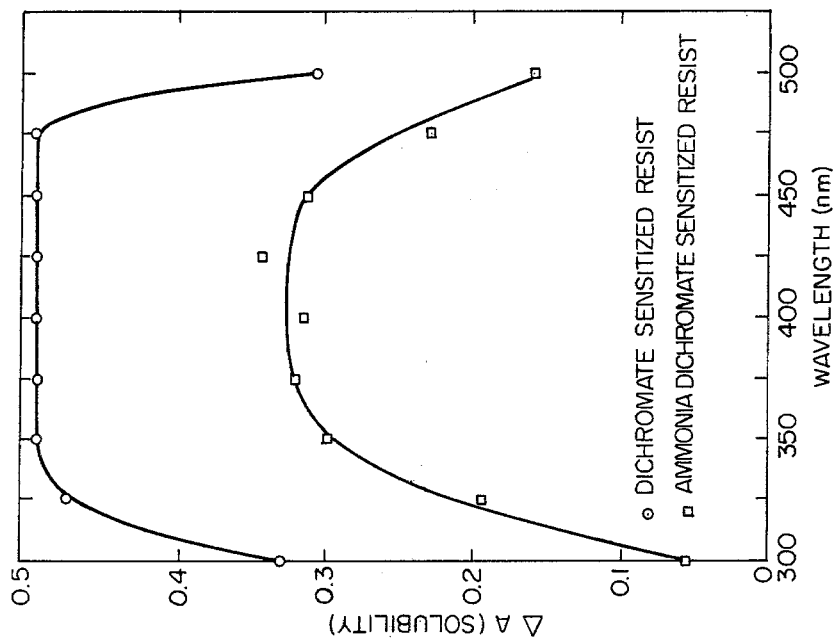
FIGS. 4 and 5 illustrate spectral sensitivity curves generated for matrix and phosphor screening resists for iron dichromate and ammonium dichromate systems, respectively.
Figure 4:
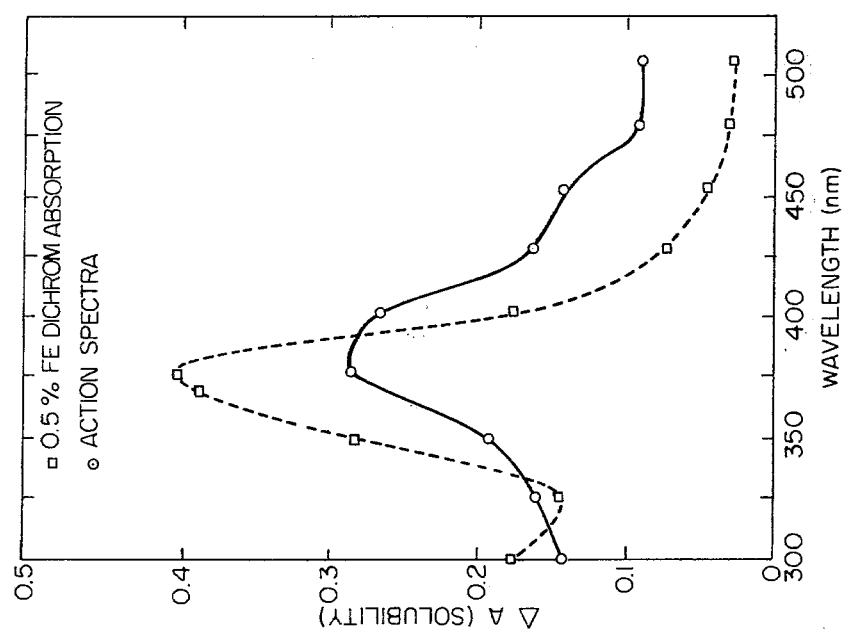

Iron in the +3 valence state was chosen for complexation because of its compatibility with the resist systems, water solubility comparable to its ammonium counterpart, and superior spectral shape over the ammonium salt. FIG. 1, shows the absorption spectra of aqueous solutions of ferric dichromate and ammonium dichromate containing identical concentrations of dichromate moiety respectively. It can be seen that the iron dichromate solution has greater blue-green absorption than the ammonium dichromate solution. FIGS. 2 and 3 are gamma curves for iron dichromated PVA photoresists vs. ammonium dichromated PVA photoresists, respectively. Steeper slopes and lower required power levels are a good indication of the increased sensitivity afforded by the iron dichromate sensitized systems of the present invention. Identical data were obtained for both laser and mercury arc sources with respect to sensitivity increase. Examination of the spectral sensitivity curves in FIGS. 4 and 5 generated for matrix and phosphor screening resists for respective iron dichromate and ammonium dichromate systems shows the enhanced sensitivity of the iron dichromate system in the blue-green region. This factor is not only beneficial when considering the laser exposure system but the emission of conventional mercury arc sources is more efficiently utilized in the blue-green region and consequently shorter exposure times are achieved.

While specific embodiments of the present invention have been described, variations and modifications will occur to those skilled in the art once acquainted with the basic concepts of the invention. Therefore, it is intended that the appended claims shall be construed to include all such variations and modifications as fall within the true spirit and scope of the invention.

What is claimed is:

1. A method of enhancing the sensitivity of a cross-linkable poly(vinyl alcohol)photoresist to radiation in the visible region of the spectrum comprising incorporating a ferric dichromate into a cross-linkable poly(vinyl alcohol) photoresist-forming composition thereby enhancing the absorptive sensitivity of the photoresist in the visible region of the spectrum.

2. A method as recited in claim 1 wherein the ferric dichromate is pre-formed and subsequently incorporated, per se, into the photoresist-forming composition.

3. A method as defined in claim 2 wherein the ferric dichromate is pre-formed and subsequently incorporated into the photoresist-forming composition in admixture with an ammonium or alkali metal dichromate salt wherein said complex comprises from about 20 to 100 percent by weight of said admixture.

4. A method as recited in claim 1 wherein the ferric dichromate is formed in situ in the photoresist-forming composition by reacting an inorganic ferric salt with an ammonium or alkali-metal dichromate salt in the photoresist-forming composition.

5. A method as recited in claim 1 wherein the photoresist-forming composition additionally contains an anionic surfactant.

6. A method as recited in claim 5 wherein the surfactant is sodium 2-ethyl hexanoate.

7. An improved method for selectively imaging a cross-linkable polymeric photoresist supported by a panel for use in a cathode-ray tube comprising:
   (i) applying the photoresist-forming composition as recited in claim 1 on said panel;
   (ii) selectively exposing said composition to radiation in the visible portion of the spectrum thereby cross-linking the exposed portions of the photoresist; and
   (iii) removing the unexposed portions of said photoresist.

8. An improved photoresist composition enhanced sensitivity to radiation in the visible region of the spectrum comprising a mixture of poly(vinyl alcohol) and ferric dichromate.

9. An improved photoresist composition as recited in claim 8 wherein the mixture comprises poly(vinyl alcohol), and an admixture of ferric dichromate and an ammonium or alkali metal dichromate, said ferric dichromate comprising from about 20 to 100 percent by weight of said admixture.

10. An improved photoresist composition as defined in claim 8 additionally containing an anionic surfactant.

11. An improved photoresist composition as defined in claim 10 wherein the surfactant is sodium 2-ethyl hexanoate.

* * * * *